United States Patent
Zhao et al.

(10) Patent No.: US 10,234,713 B2
(45) Date of Patent: Mar. 19, 2019

(54) DISPLAY PANEL AND DISPLAY DEVICE (71) Applicants: BOE Technology Group Co., Ltd., Beijing (CN); Beijing BOE Optoelectronics Technology Co., Ltd., Beijing (CN)

(72) Inventors: Wenqing Zhao, Beijing (CN); Xiaochuan Chen, Beijing (CN); Hongbo Feng, Beijing (CN); Qian Wang, Beijing (CN); Jian Gao, Beijing (CN); Pengcheng Lu, Beijing (CN); Xiaochen Niu, Beijing (CN); Rui Xu, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 15/529,785

(22) PCT Filed: Oct. 24, 2016

(86) PCT No.: PCT/CN2016/103000
§ 371 (c)(1),
(2) Date: May 25, 2017

(87) PCT Pub. No.: WO2017/118162
PCT Pub. Date: Jul. 13, 2017

(65) Prior Publication Data
US 2018/0081235 A1 Mar. 22, 2018

(30) Foreign Application Priority Data
Jan. 8, 2016 (CN) .......................... 2016 1 0011794

(51) Int. Cl.
*G02B 5/18* (2006.01)
*H01L 51/50* (2006.01)
(Continued)

(52) U.S. Cl.
CPC ..... *G02F 1/133504* (2013.01); *G02B 5/1866* (2013.01); *H01L 51/5036* (2013.01);
(Continued)

(58) Field of Classification Search
None
See application file for complete search history.

(56) References Cited

U.S. PATENT DOCUMENTS

2001/0005243 A1* 6/2001 Yamaguchi ....... G02F 1/133602
349/61
2007/0139582 A1* 6/2007 Numata ............... G02B 6/0053
349/61

(Continued)

FOREIGN PATENT DOCUMENTS

CN 101498802 A 8/2009
CN 205281080 U 6/2016
(Continued)

OTHER PUBLICATIONS

Dec. 29, 2016—(WO) International Search Report and Written Opinion Appn PCT/CN2016/103000 with English Tran.

*Primary Examiner* — Ryan Crockett
(74) *Attorney, Agent, or Firm* — Banner & Witcoff, Ltd.

(57) ABSTRACT

A display panel and a display device are provided. The display panel includes a first substrate and a second substrate that disposed opposite to each other, and a first optical film that provided on a side of the first substrate facing the second substrate. The first optical film is provided with a plurality of nanoscale microstructures, so that the first optical film is (Continued)

capable of splitting incident white light into a plurality of monochromatic light beams with different colors.

19 Claims, 3 Drawing Sheets

(51) Int. Cl.
  *H01L 51/52* (2006.01)
  *G02F 1/1333* (2006.01)
  *G02F 1/1335* (2006.01)

(52) U.S. Cl.
  CPC ...... *H01L 51/5262* (2013.01); *H01L 51/5275* (2013.01); *H01L 51/5284* (2013.01); *G02B 2005/1804* (2013.01); *G02B 2207/101* (2013.01); *G02F 1/133512* (2013.01); *G02F 2001/133357* (2013.01); *G02F 2001/133565* (2013.01); *G02F 2203/34* (2013.01); *H01L 51/5253* (2013.01); *H01L 2251/5315* (2013.01)

(56) References Cited

U.S. PATENT DOCUMENTS

| | | | |
|---|---|---|---|
| 2010/0165464 A1* | 7/2010 | Lin | G02B 3/0037 359/570 |
| 2014/0197388 A1* | 7/2014 | Zhang | H01L 51/5271 257/40 |
| 2016/0146984 A1* | 5/2016 | Jiang | G02B 5/1842 359/567 |

FOREIGN PATENT DOCUMENTS

| | | |
|---|---|---|
| CN | 205485174 U | 8/2016 |
| TW | 201024806 A1 | 7/2010 |

\* cited by examiner

DISPLAY PANEL AND DISPLAY DEVICE

The application is a U.S. National Phase Entry of International Application No. PCT/CN2016/103000 filed on Oct. 24, 2016, designating the United States of America and claiming priority to Chinese Patent Application No. 201610011794.0, filed Jan. 8, 2016. The present application claims priority to and the benefit of the above-identified applications and the above-identified applications are incorporated by reference herein in their entirety.

TECHNICAL FIELD

The present disclosure relates to a display panel and a display device.

BACKGROUND

A thin film transistor liquid crystal display (TFT-LCD) has advantages of small size, low power, no radiation and so on, which occupies a dominant position in current flat panel display market.

A color filter is an important component in a liquid crystal display. In a liquid crystal display, light emitted by a backlight module is processed by a color filter in order to present a color picture. An existing liquid crystal display (LCD) mostly adopts a traditional organic pigment or a dye to make the color filter, and white light is converted into three primary colors of R (red), G (green), and B (blue) by using a principle of different color filtering. However, an efficiency of transmission light with three primary colors emitted by an existing color filter is low, and the loss of luminous efficiency is about 60-70%. Especially, the higher the color purity, the more serious the loss of the luminous efficiency.

SUMMARY

At least one embodiment of the present disclosure provides a display panel, and the display panel comprises a first substrate and a second substrate that are disposed opposite to each other, wherein, a first optical film is provided on a side of the first substrate facing the second substrate, the first optical film is provided with a plurality of nanoscale microstructures, so that the first optical film is capable of splitting incident white light into a plurality of monochromatic light beams with different colors.

In some examples, the display panel comprises a display area and a peripheral area surrounding the display area, the plurality of nanoscale microstructures is distributed at least on the whole display area of the display panel.

In some examples, the incident white light is collimated light.

In some examples, the plurality of nanoscale microstructures on the first optical film is a plurality of nanoscale grooves.

In some examples, the grooves are cuboid grooves, conical grooves, hemispherical grooves or semi ellipsoidal grooves.

In some examples, the display panel further comprises a black matrix pattern with a plurality of hollow portions formed on a light exit side of the first optical film, and each of the hollow portions only allows a monochromatic light beam with one color to pass through.

In some examples, the display panel further comprises a planarization layer formed between the black matrix pattern and the first optical film.

In some examples, the display panel further comprises a second optical film configured to expand a divergence angle of the monochromatic light beams. The second optical film is located between the black matrix pattern and the second substrate or located on a side of the second substrate facing away from the first substrate.

In some examples, the second optical film is a diffusion film or a wide viewing-angle film.

In some examples, the display panel further comprises a fourth optical film disposed on a light exit side of the first optical film, and the fourth optical film is configured to adjust an emergent direction of the monochromatic light beams.

In some examples, the hollow portions comprise a plurality of first hollow portions allows first color light to pass through, a plurality of second hollow portions allows second color light to pass through, and a plurality of third hollow portions allows third color light to pass through. The plurality of first hollow portions, the plurality of second hollow portions and the plurality of third hollow portions are evenly distributed on the whole display area of the display panel, respectively.

In some examples, the display panel is a liquid crystal display panel.

In some examples, the display panel further comprises a liquid crystal layer disposed between the first optical film and the second substrate.

In some examples, the display panel is an organic light-emitting diode (OLED) display panel, the first substrate is an OLED array substrate or a package substrate, the OLED array substrate is provided with a white light emitting layer, the first optical film is located on a light exit side of the white light emitting layer.

In some examples, the display panel further comprises a third optical film disposed between the white light emitting layer and the first optical film, and the third optical film is configured to convert divergent light emitted by the white light emitting layer into collimated light.

Another embodiment of the present disclosure provides a display device, which comprises any one of display panels as mentioned above.

In some examples, the display panel is a liquid crystal panel, the display device further comprises a backlight module configured to provide a collimated light source for the liquid crystal display panel.

In some examples, the display panel is an organic light-emitting diode (OLED) display panel, and the first substrate is an OLED array substrate or a package substrate. The OLED array substrate is provided with a white light emitting layer, and the first optical film is located on a light exit side of the white light emitting layer.

BRIEF DESCRIPTION OF THE DRAWINGS

In order to clearly illustrate the technical solution of the embodiments of the disclosure, the drawings of the embodiments will be briefly described in the following; it is obvious that the drawings in the description are only related to some embodiments of the disclosure and not limited to the disclosure.

DETAILED DESCRIPTION

In order to make objects, technical details and advantages of embodiments of the disclosure, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

At least one embodiment of the present disclosure provides a display panel and a display device aiming at a problem that efficiency of transmission light with three primary colors exited from a color filter in prior art is very low, and luminous efficiency loss is about 60-70%. The technical solution of the present disclosure is capable of reducing luminous efficiency loss of the display device and improving luminous efficiency of the display device.

First Embodiment

The embodiment provides a display panel, and the display panel comprises a first substrate and a second substrate that are disposed opposite to each other, and a first optical film, which is provided on a side of the first substrate facing the second substrate. The first optical film is provided with a plurality of nanoscale microstructures, so that the first optical film is capable of splitting incident white light into a plurality of monochromatic light beams with different colors.

The first optical film is provided on the display panel provided by the embodiment, and the first optical film is provided with the plurality of nanoscale microstructures. The white light is diffracted and interfered upon passing through the nanoscale microstructures, and then dispersed, so that the incident white light is split into the plurality of monochromatic light beams with different colors. The first optical film provided by the embodiment may be used to replace a color filter to realize color display, and since the white light is split into the plurality of monochromatic light beams with different colors in the embodiment, rather than filtered light with other colors to obtain monochromatic light beams, which is capable of reducing luminous efficiency loss of the display device and greatly improving luminous efficiency of the display device.

For example, the incident white light is collimated light.

In some examples, the microstructures may be grooves, that is, the first optical film is provided with a plurality of nanoscale grooves. The white light is diffracted and interfered upon passing through the nanoscale grooves, and then dispersed, so that the incident white light is split into a plurality of monochromatic light beams with different colors. However, the microstructures are not limited to the use of grooves, the microstructures may also be bumps or other structures, as long as the first optical film is capable of meeting that the incident white light are split into the plurality of monochromatic light beams with different colors.

In some examples, the grooves have a shape of cuboid, cone, hemisphere or semi ellipsoid.

For example, the display panel further comprises a black matrix pattern with a plurality of hollow portions formed on a light exit side of the first optical film, and each of the hollow portions only allows a monochromatic light beam with one color to pass through. The black matrix pattern matches a position of the plurality of monochromatic light beams with different colors which are split by the white light, so that each of the hollow portions only allows a monochromatic light beam with one color to pass through. Through the design of the black matrix pattern, the plurality of monochromatic light beams with different colors as required may be obtained.

For example, the display panel further comprises a planarization layer, which is formed between the black matrix pattern and the first optical film. In this way, the planarization layer interposed between the black matrix pattern and the first optical film may provide an enough divergence distance to the plurality of monochromatic light beams split by the white light.

For example, since a viewing-angle of the plurality of monochromatic light beams split by the white light is relatively small, the display panel further comprises a second optical film, which is configured to expand a divergence angle of the monochromatic light beams. The second optical film is located between the black matrix pattern and the second substrate or located on a side of the second substrate facing away from the first substrate. The second optical film is capable of expanding the divergence angle of the monochromatic light beams, in order to expand a viewing-angle of the display panel.

In some examples, the second optical film is a diffusion film or a wide viewing-angle film. For example, the second optical film may be other optical structures which are capable of expanding the divergence angel of the monochromatic light beams.

For example, since the incident light of the first optical film is collimated light, in order to ensure that an emergent direction of the monochromatic light beams of the first optical film corresponds to a pixel electrode, the display panel further comprises a fourth optical film, which is disposed on a light exit side of the first optical film, and configured to adjust the emergent direction of the monochromatic light beams.

The fourth optical film may comprise a plurality of dielectric layers with different refractive index, and a refractive index difference is generated at the interface, so that the emergent direction of the monochromatic light beams may be adjusted. The fourth optical film may also be composed of micro prism. For example, the emergent direction of the monochromatic light beams may also be controlled through a groove shape of the microstructures.

In some examples, the display panel is a liquid crystal display panel, and the first substrate is an array substrate or a color filter substrate.

In some examples, the display panel is an organic light-emitting diode (OLED) display panel, the first substrate is an OLED array substrate or a package substrate. The OLED array substrate is provided with a white light emitting layer, the first optical film is located on a light exit side of the white light emitting layer.

For example, in a case that the display panel is the OLED display panel, since the first optical film is only capable of splitting white collimated light into the plurality of monochromatic light beams with different colors, therefore, the display panel further comprises a third optical film, which is disposed between the white light emitting layer and the first optical film, and configured to convert divergent light exited from the white light emitting layer into collimated light. In some examples, the third optical film may be a prism film or other optical structures, as long as converting the divergent light into the collimated light.

Second Embodiment

The embodiment provides a display device, which comprises any one of display panels as mentioned above. The display device may be a liquid crystal television, a liquid crystal display, a digital photo frame, a mobile phone, a tablet computer and other products or components with display function.

For example, in a case that the display panel is a liquid crystal panel, since the first optical film is only capable of splitting white collimated light into the plurality of monochromatic light beams with different colors; therefore, the display device further comprises a backlight module, which is configured to provide a collimated light source for the liquid crystal display panel.

The backlight module may directly comprise a collimated light source, or comprise a combination of an ordinary divergent light source and the third optical film.

Third Embodiment

Figure 1:
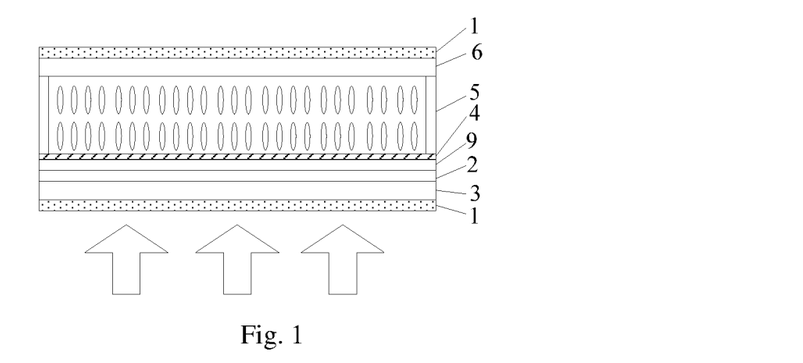
FIG. 1 is a schematic diagram of a structure of a display device provided by an embodiment of the present disclosure.

As illustrated in FIG. 1, a display device provided by the embodiment comprises a first substrate 3 and a second substrate 6 that are disposed opposite to each other. The first substrate 3 and the second substrate 6 are sealed by sealant 5, and a liquid crystal layer is disposed between the first substrate 3 and the second substrate 6. Both of the first substrate 3 and the second substrate 6 are attached with a polarizer 1. In a case that incident light is polarized light, the polarizer attached to the first substrate 3 may be omitted.

For example, the display device further comprises a backlight module, which is configured to provide a collimated light source, the backlight module comprises a collimated light source, or comprise a combination of an ordinary divergent light source and a third optical film. In a case that the backlight module comprises an ordinary emitting light source, the ordinary emitting light source may be light-emitting diode (LED) or an organic light-emitting diode (OLED), the third optical film may be a prism film or other optical structures, as long as converting divergent light by the ordinary light source into collimated light.

Figure 3:
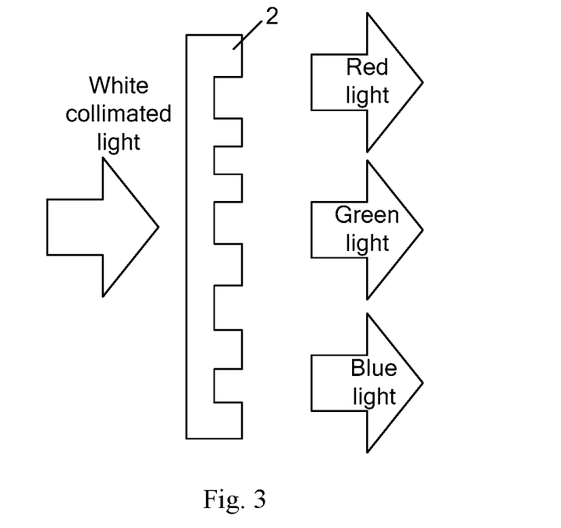
FIG. 3 is a schematic diagram that a first optical film splits white light into monochromatic light beams of red light, green light and blue light etc. provided by an embodiment of the present disclosure.

As illustrated in FIG. 1, a first optical film 2 is provided on a side of the first substrate 3 facing the second substrate 6, and the first optical film 2 may be made of transparent insulating material. Refractive index of the first optical film 2 may be approximately the same as refractive index of the first substrate 3, for example, the refractive index is about 1.5. The first optical film 2 is provided with a plurality of nanoscale microstructures, so that the first optical film 2 is capable of splitting incident white light into a plurality of monochromatic light beams with different colors. As illustrated in FIG. 3, the first optical film 2 is capable of splitting the incident white light into monochromatic light beams with red light, blue light, green light and so on.

Figure 4:
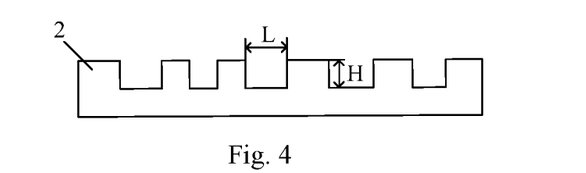
FIG. 4 is a schematic diagram of a structure of a first optical film provided by an embodiment of the present disclosure.

In some examples, as illustrated in FIG. 4, the first optical film 2 is provided with a plurality of nanoscale grooves, and the grooves may be specifically cuboid grooves, conical grooves, hemispherical grooves or semi ellipsoidal grooves. Through the design of length L and depth H of the grooves, the first optical film 2 is capable of splitting the incident white light collimated light into the plurality of monochromatic light beams as required. It may also through the design of length L and depth H of the grooves, in order to achieve a required direction of emergent light. For example, the direction of the emergent light may also be controlled by a refractive index difference produced by arranging different dielectric layers, and may also be controlled by a micro prism.

Figure 5:
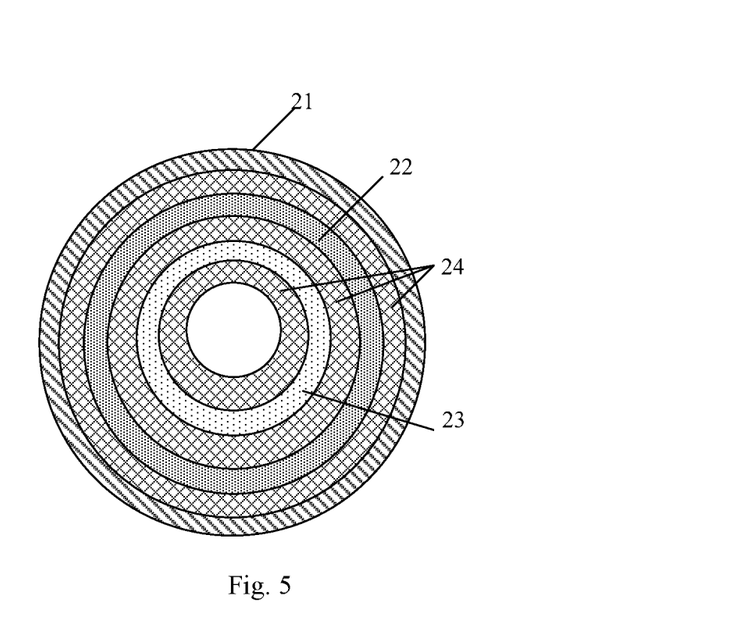
FIG. 5 is a schematic diagram of monochromatic light beams dispersion after a first optical film splitting white light into monochromatic light beams of red light, green light and blue light etc. provided by an embodiment of the present disclosure.
Figure 6:
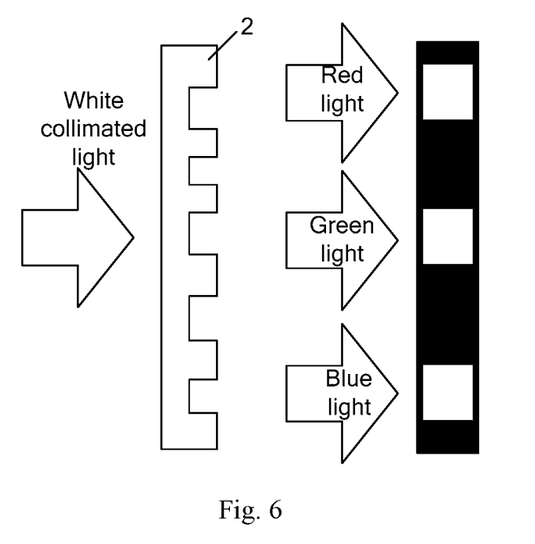
FIG. 6 is a schematic diagram of a matching relationship between a black matrix pattern and a position of monochromatic light provided by an embodiment of the present disclosure.

The monochromatic light beams split from the white collimated light dispersed by the first optical film 2 is illustrated in FIG. 5, it should be noted that, the dispersion wavelength distribution of light is continuous color light, and width of the monochromatic light beams is not easy to be selected and used alone, and it is possible to match a black matrix pattern to correspond to emergent of pure color light, in order to achieve a high color gamut display device. Further, as illustrated in FIG. 1, the display device further comprises a black matrix pattern 4, which is disposed on a light exit side of the first optical film 2. Through the design of the black matrix pattern, as illustrated in FIG. 6, the black matrix pattern is matched with a position of the plurality of monochromatic light beams with different colors which is split from the white light, and each of hollow portions only allows a monochromatic light beam with one color to pass through, so that the hollow portions of the black matrix may only exit pure light which is needed. For example, a wavelength range of exited red light is 630 nm-780 nm, and a representative wavelength is 700 nm; a wavelength range of exited green light is 500 nm-570 nm, and a representative wavelength is 550 nm; a wavelength range of exited blue light is 420 nm-470 nm, and a representative wavelength is 470 nm.

Figure 2:
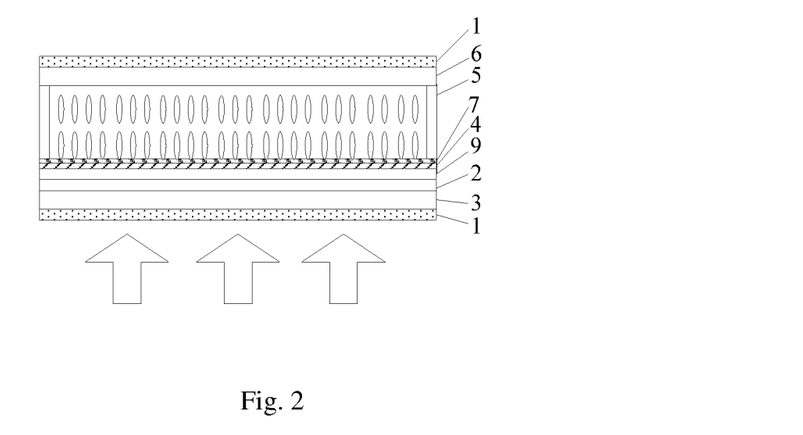
FIG. 2 is a schematic diagram of a structure of a display device provided by another embodiment of the present disclosure.

In the embodiment, if the intensity of the monochromatic light beams with different wavelengths which are exited from the black matrix pattern is different, a brightness correction method may be used, that is, adjusting a pixel voltage of a driving liquid crystal to achieve a corresponding match of a gray level. For example, as illustrated in FIG. 1 or FIG. 2, the liquid crystal layer may be disposed between the second substrate 6 and the first optical film 2. In some examples, the liquid crystal layer may be disposed between the second substrate 6 and the black matrix pattern 4.

In the embodiment, a planarization layer 9 is further disposed between the black matrix pattern 4 and the first optical film 2. Since an initial divergence angle of the plurality of monochromatic light beams with different colors which are split from the white light is relatively small, the thickness of the planarization layer 9 may provide a sufficient divergence distance to the plurality of monochromatic light beams. If a larger divergence distance is needed, a required divergence distance may be obtained by adjusting the thickness of the planarization layer 9, in order to obtain a required width of the monochromatic light beams.

For example, since a viewing-angle of the plurality of monochromatic light beams which are split from the white collimated light is relatively small, as illustrated in FIG. 2, the display device further comprises a second optical film 7, which is located on a side of the black matrix pattern 4 facing away from the first optical film 2. The second optical film 7 is capable of expanding a divergence angle of the monochromatic light beams, in order to expand a viewing-angle of the display device. The second optical film 7 may be disposed on the first substrate 3 or the second substrate 6, as long as disposed on a side of the black matrix pattern 4 facing away from the first optical film 2. For example, the second optical film 7 may be a diffusion film or a wide viewing-angle film. For example, the second optical film 7 may be other optical structures which are capable of expanding the divergence angle of the monochromatic light beams, such as, a polarizer with an extended viewing-angle function, a liquid crystal film, material with gradual changed refractive index, micro structure and so on. The liquid crystal film may be discotic liquid crystal with a fixed arrangement or other liquid crystals with a fixed arrangement.

The first optical film is provided on a side of the first substrate opposite to the second substrate in the embodiment, and the first optical film is provided with a plurality of nanoscale grooves. The white collimated light is diffracted and interfered in a case that passing by the nanoscale microstructures, and then dispersed, so that incident white light is split into the plurality of monochromatic light beams with different colors. The first optical film provided by the embodiment may be used to replace a color filter to realize color display, and since the white light is split into the plurality of monochromatic light beams with different colors in the embodiment, rather than filtered light with other colors to obtain monochromatic light beams, which is capable of reducing luminous efficiency loss of the display device and greatly improving luminous efficiency of the display device.

Fourth Embodiment

Figure 7:
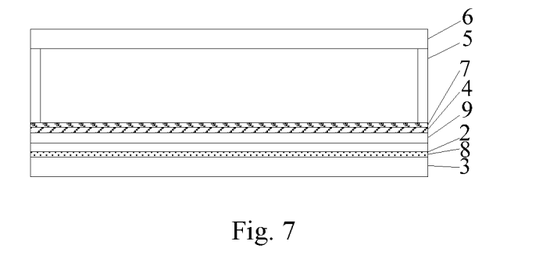
FIG. 7 is a schematic diagram of a structure of a display device provided by another embodiment of the present disclosure.

As illustrated in FIG. 7, a display device provided by the embodiment comprises a first substrate 3 and a second substrate 6 that are disposed opposite to each other. The first substrate 3 and the second substrate 6 are sealed by sealant 5. The second substrate 6 is a package substrate, and the first substrate 3 is an OLED array substrate. The OLED array substrate is provided with a white light emitting layer. The display device further comprises a third optical film 8, which is disposed on a light exit side of the white light emitting layer, and configured to convert white divergent light emitted from the white light emitting layer into white collimated light. In some examples, the third optical film may be a prism film or other optical structures, as long as converting divergent light into collimated light.

As illustrated in FIG. 7, a first optical film 2 is provided on a side of the first substrate 3 facing the second substrate 6, and located on a side of the third optical film 3 facing away from the white emitting layer. The first optical film 2 may be made of transparent insulating material. Refractive index of the first optical film 2 may be approximately the same as refractive index of the first substrate 3, for example, the refractive index is about 1.5. The first optical film 2 is provided with a plurality of nanoscale microstructures, so that the first optical film 2 is capable of splitting incident white collimated light into a plurality of monochromatic light beams with different colors. As illustrated in FIG. 3, the first optical film 2 is capable of splitting the incident white collimated light into monochromatic light beams such as red light, blue light, and green light.

For example, as illustrated in FIG. 4, the first optical film 2 is provided with a plurality of nanoscale grooves, and the grooves may be cuboid grooves, conical grooves, hemispherical grooves or semi ellipsoidal grooves. Through the design of length L and depth H of the grooves, the first optical film 2 is capable of splitting the incident white light collimated light into the plurality of monochromatic light beams as required. It may also through the design of length L and depth H of the grooves, in order to achieve a required direction of emergent light. For example, the direction of the emergent light may also be controlled by a refractive index difference produced by setting different dielectric layers, and may also be controlled by a micro prism.

The monochromatic light beams split from the white collimated light dispersed by the first optical film 2 is illustrated in FIG. 5, it should be noted that, the dispersion wavelength distribution of light is continuous color light, and width of the monochromatic light beams is not easy to be selected and used alone, and it is possible to match a black matrix pattern to correspond to emergent of pure color light, in order to achieve a high color gamut display device. For example, as illustrated in FIG. 7, the display device further comprises a black matrix pattern 4, which is disposed on a light exit side of the first optical film 2. Through the design of the black matrix pattern, as illustrated in FIG. 6, the black matrix pattern is matched with a position of the plurality of monochromatic light beams with different colors which is split from the white light, and each of hollow portions only allows a monochromatic light beam with one color to pass through, so that the hollow portions of the black matrix may only exit monochromatic light which is needed. For example, a wavelength range of exited red light is 630 nm-780 nm, and a representative wavelength is 700 nm; a wavelength range of exited green light is 500 nm-570 nm, and a representative wavelength is 550 nm; a wavelength range of exited blue light is 420 nm-470 nm, and a representative wavelength is 470 nm.

In the embodiment, if the intensity of the monochromatic light beams with different wavelengths which are exited from the black matrix pattern is different, a brightness correction method may be used, that is, adjusting a pixel voltage of a driving liquid crystal to achieve a corresponding match of a gray level.

In the embodiment, a planarization layer 9 is further disposed between the black matrix pattern 4 and the first optical film 2. Since an initial divergence angle of the plurality of monochromatic light beams with different colors which are split from the white light is relatively small, the thickness of the planarization layer 9 may provide a sufficient divergence distance to the plurality of monochromatic light beams. If a larger divergence distance is needed, a required divergence distance may be obtained by adjusting the thickness of the planarization layer 9, in order to obtain a required width of the monochromatic light beams.

For example, since a viewing-angle of the plurality of monochromatic light beams which are split from the white collimated light is relatively small, as illustrated in FIG. 7, the display device further comprises a second optical film 7, which is located on a side of the black matrix pattern 4 facing away from the first optical film 2. The second optical film 7 is capable of expanding a divergence angle of the monochromatic light beams, in order to expand a viewing-angle of the display device. The second optical film 7 may be disposed on the first substrate 3 or the second substrate 6, as long as disposed on a side of the black matrix pattern 4 facing away from the first optical film 2. For example, the second optical film 7 may be a diffusion film or a wide viewing-angle film. For example, the second optical film 7 may further be other optical structures which are capable of expanding the divergence angle of the monochromatic light beams, such as, a polarizer with an viewing-angle enhancement function, a liquid crystal film, a material with gradual changed refractive index, micro structure of concave lens and so on. The liquid crystal film may be discotic liquid crystal with a fixed arrangement or other liquid crystals with a fixed arrangement.

Figure 8:
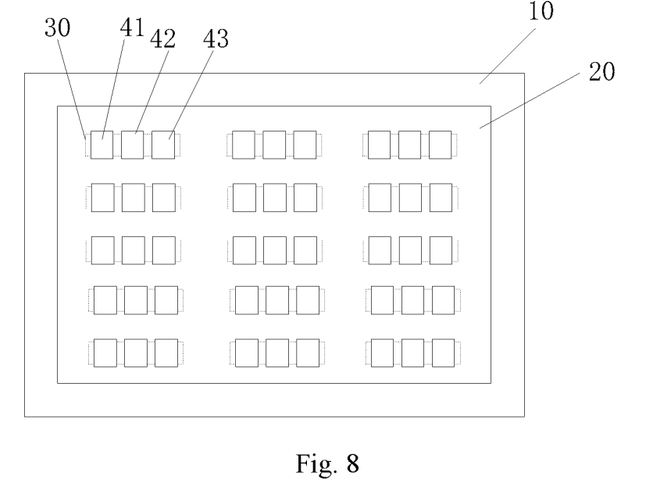
FIG. 8 is a schematic diagram of a planar structure of some display devices provided by an embodiment of the present disclosure.

For example, FIG. 8 schematically illustrates a planar structure diagram of a display panel according to some examples of the present disclosure. For example, the display panel comprises a display area 20 and a peripheral area 10 surrounding the display area 20, the nanoscale microstructures 30 are distributed at least on the whole display area 20 of the display panel.

For example, as illustrated in FIG. 8, the hollow portions comprise a plurality of first hollow portions 41 allow first color light to pass through, a plurality of second hollow portions 42 allow second color light to pass through, and a plurality of third hollow portions 43 allow third color light to pass through, the plurality of first hollow portions 41, the plurality of second hollow portions 42 and the plurality of third hollow portions 43 are evenly distributed on the whole display area of the display panel, respectively.

It should be noted that, FIG. 8 only illustrates a distribution of the nanoscale microstructures and the hollow portions of the black matrix in the display area of the display panel. A rectangular shape representing the microstructures 30 and the hollow portions 41, 42 and 43 do not necessarily indicate the shape of the microstructures and the hollow portions, and the shape of the microstructures and the hollow portions may be taken in any suitable shapes. For example, the plurality of hollow portions 41, 42, and 43 distributed in the display area may correspond to a plurality of sub pixels of the display panel. Since different hollow portions may transmit light with different colors, and the brightness of each of the sub pixels may be modulated by the liquid crystal layer, therefore, the light with different colors may be combined into light with different colors for color displaying.

The first optical film is provided on a side of the first substrate facing the second substrate in the embodiment, and the first optical film is provided with a plurality of nanoscale grooves. The white collimated light is diffracted and interfered in a case that passing by the nanoscale microstructures, and then dispersed, so that incident white light is split into the plurality of monochromatic light beams with different colors. The first optical film provided by the embodiment may be used to replace a color filter to realize color displaying, and since the white light is split into the plurality of monochromatic light beams with different colors in the embodiment, rather than filtered light with other colors to obtain monochromatic light beams, which is capable of reducing luminous efficiency loss of the display device and greatly improving luminous efficiency of the display device.

The foregoing are only some specific embodiments of the present disclosure, and the protection scope of the present disclosure is not limited thereto. The protection scope of the present disclosure is defined by the claims.

The application claims priority to the Chinese patent application No. 201610011794.0, filed Jan. 8, 2016, the entire disclosure of which is incorporated herein by reference as part of the present application.

What is claimed is:

1. A display panel, comprising: a first substrate and a second substrate that are disposed opposite to each other, wherein, a first optical film is provided on a side of the first substrate facing the second substrate, the first optical film is provided with a plurality of nanoscale microstructures, so that the first optical film is capable of splitting incident white light into a plurality of monochromatic light beams with different colors, the first optical film is provided with a planar surface at a side of the first optical film receiving the incident white light, and the plurality of nanoscale microstructures are located at a side of the first optical film opposite to the side of the first optical film receiving the incident white light.

2. The display panel according to claim 1, wherein, the display panel comprises a display area and a peripheral area surrounding the display area, the plurality of nanoscale microstructures is distributed at least on the whole display area of the display panel.

3. The display panel according to claim 2, further comprising:
    a black matrix pattern with a plurality of hollow portions formed on a light exit side of the first optical film, wherein, each of the hollow portions only allows a monochromatic light beam with one color to pass through.

4. The display panel according to claim 3, further comprising:
    a planarization layer formed between the black matrix pattern and the first optical film.

5. The display panel according to claim 3, further comprising:
    a second optical film, configured to expand a divergence angle of the monochromatic light beams, the second optical film is located between the black matrix pattern and the second substrate or located on a side of the second substrate facing away from the first substrate.

6. The display panel according to claim 5, wherein, the second optical film is a diffusion film or a wide viewing-angle film.

7. The display panel according to claim 3, wherein, the hollow portions comprise a plurality of first hollow portions which allow first color light to pass through, a plurality of second hollow portions which allow second color light to pass through, and a plurality of third hollow portions which allow third color light to pass through, the plurality of first hollow portions, the plurality of second hollow portions, and the plurality of third hollow portions are evenly distributed on the whole display area of the display panel.

8. The display panel according to claim 1, wherein, the incident white light is collimated light.

9. The display panel according to claim 1, wherein, the plurality of nanoscale microstructures on the first optical film comprises a plurality of nanoscale grooves.

10. The display panel according to claim 9, wherein, the nanoscale grooves are cuboid grooves, conical grooves, hemispherical grooves or semi ellipsoidal grooves.

11. The display panel according to claim 9, wherein, each of the plurality of nanoscale grooves has a rectangular cross section.

12. The display panel according to claim 1, further comprising:
    a fourth optical film, disposed on a light exit side of the first optical film, configured to adjust an emergent direction of the monochromatic light beams.

13. The display panel according to claim 1, wherein, the display panel is a liquid crystal display panel.

14. The display panel according to claim 13, further comprising: a liquid crystal layer disposed between the first optical film and the second substrate.

15. The display panel according to claim 1, wherein, the display panel is an organic light-emitting diode (OLED) display panel, the first substrate is an OLED array substrate or a package substrate, the OLED array substrate is provided with a white light emitting layer, the first optical film is located on a light exit side of the white light emitting layer.

16. The display panel according to claim 15, further comprising:
- a third optical film, disposed between the white light emitting layer and the first optical film, and configured to convert divergent light emitted by the white light emitting layer into collimated light.

17. A display device, comprising the display panel according to claim 1.

18. The display device according to claim 17, wherein, the display panel is a liquid crystal display panel, the display device further comprising: a backlight module configured to provide a collimated light source for the liquid crystal display panel.

19. The display device according to claim 17, wherein, the display panel is an organic light-emitting diode (OLED) display panel, the first substrate is an OLED array substrate or a package substrate, the OLED array substrate is provided with a white light emitting layer, the first optical film is located on a light exit side of the white light emitting layer.

* * * * *